United States Patent [19]

Klehm, Jr.

[11] E Patent Number: Re. 31,942

[45] Reissued Date of Patent: Jul. 9, 1985

[54] HIGH SPEED SERIAL SCAN AND READOUT OF KEYBOARDS

[76] Inventor: William G. Klehm, Jr., 31185 Berryhill Rd., Farmington, Mich. 48024

[21] Appl. No.: 544,383

[22] Filed: Jan. 27, 1975

Related U.S. Patent Documents

Reissue of:

[64] Patent No.: 3,745,536
Issued: Jul. 10, 1973
Appl. No.: 119,490
Filed: Mar. 1, 1971

[51] Int. Cl.[3] ..... G11C 19/00

[52] U.S. Cl. ..... 340/365 E; 340/365 S; 340/711; 178/17.5

[58] Field of Search ..... 340/365 S, 365 E, 172.5, 340/365 R, 711, 715; 178/17 R, 17 A, 17 C, 17.5

[56] References Cited

U.S. PATENT DOCUMENTS

| | | | |
|---|---|---|---|
| 2,814,031 | 11/1957 | Davis . | |
| 2,883,255 | 4/1959 | Anderson . | |
| 2,883,651 | 4/1959 | Akerlund . | |
| 2,905,520 | 9/1959 | Anderson . | |
| 2,997,703 | 8/1961 | Powell | 340/365 L |
| 3,129,418 | 4/1964 | De La Tour . | |
| 3,185,823 | 5/1965 | Ellersick, Jr. et al. . | |
| 3,234,533 | 2/1966 | Poli . | |
| 3,292,764 | 12/1966 | Midgetto et al. | 400/50 |
| 3,293,640 | 12/1966 | Chalfin et al. . | |
| 3,308,918 | 3/1967 | James | 340/365 R |
| 3,351,917 | 11/1967 | Shimabukuro | 364/900 |
| 3,419,697 | 12/1968 | Gove . | |
| 3,437,795 | 4/1969 | Kuljian . | |
| 3,444,519 | 5/1969 | Lutgenau . | |
| 3,454,147 | 7/1969 | Schrem | 340/365 R |
| 3,456,077 | 7/1969 | Jones, Jr. | 178/17 R |
| 3,457,368 | 7/1969 | Houcke | 178/17 R |
| 3,470,539 | 9/1969 | Proud, Jr. et al. | 400/50 |
| 3,540,004 | 11/1970 | Hansen | 364/900 |
| 3,544,967 | 12/1970 | Sallach | 364/900 |
| 3,588,875 | 6/1971 | Gabor . | |
| 3,626,409 | 12/1971 | Hill et al. . | |
| 3,643,222 | 2/1972 | Kimura . | |
| 3,653,038 | 3/1972 | Webb et al. . | |
| 3,660,838 | 5/1972 | Gove et al. . | |
| 3,675,239 | 7/1972 | Ackerman | 340/365 E |
| 3,676,615 | 7/1972 | Wiedmer . | |
| 3,691,555 | 9/1972 | Looschen . | |
| 3,792,466 | 7/1974 | Arnold | 340/365 E |

OTHER PUBLICATIONS

Instruction Manual RA-170 Operations Recorder, Rochester Instrument Systems, Rochester, N.Y.

A Polyphonic Keyboard for a Voltage-Controlled Synthesizer, Hovey and Seamans; JAES vol. 23, #6, Jul.-/Aug. 1975, pp. 459-465.

"TTL Integrated Circuits-Applications of MSI Devices" by Jeff Kalb, National Semiconductor, Apr. 1970, pp. 10 and 12, Apr. 1970.

"Data Bulletin Number 170E Operations Recorder" dated Jul. 1968 and prepared by Rochester Instrument Services, Inc., Rochester, New York.

"Instruction Manual for Sequential Operations Recorder Type RA-170E" dated Feb. 1968 and prepared by Rochester Instrument Systems, Rochester, New York.

4-page document concerning RiS RA-17ON dated 8/27/68.

"Instruction Manual for Sequential Operations Recorder" dated Dec. 1970 and prepared by Rochester Instrument Systems, Inc. Rochester, New York.

IBM Technical Disclosure Bulletin, vol. 8, No. 11, Apr. 1966, pp. 1,502-1,504, "Typewriter With Electronic Separation of Input" by Becker.

*Primary Examiner*—Marshall M. Curtis

[57] ABSTRACT

Relates generally to the production of electrical signals from a keyboard, each key of which is individually operatively associated with a switching device whose activation to electrical conductive condition is controlled by the displacement of the key. These switches are hermetically sealed from the atmosphere and are electrically scanned in succession at relatively high speeds and at a repetitious rate such that several scanning cycles occur during the normal activation of a selected key. The keyboard mechanism also includes a shift register having one more bit position than the number of switch devices and into which a bit is introduced into the "one" position at the instant the scan encounters a closed switch of the keyboard. This bit is then shifted through the register in timed relation to the scan of the remaining key switches and unloaded into the last bit position of the register. A detector senses the presence of a bit in both the "one" position and the last position of the shift register and upon detection of a bit solely in the one position it delivers a signal indicative of the character represented by the actuated key and upon detecting bits in the two extreme positions of the shift register it nullifies the delivery of such a signal.

24 Claims, 5 Drawing Figures

HIGH SPEED SERIAL SCAN AND READOUT OF KEYBOARDS

Matter enclosed in heavy brackets [ ] appears in the original patent but forms no part of this reissue specification; matter printed in italics indicates the additions made by reissue.

BACKGROUND OF THE INVENTION

This invention is directed to that field of art pertaining to the keyboard generation of data and more particularly to a keyboard mechanism in which key actuated entries in one notation, such as a decimal, are converted and transduced into electrical signals in another notation, such as binary.

Many forms of mechanical and electrical read-out circuits have been suggested in the past for keyboards for assuring contact engagement or circuit closed condition and for precluding erroneous keyboard entries from being printed or otherwise utilized. Attempts have been made in the past for electrically scanning the keyboard actuated switches in succession in order to read out the actuated key of the keyboard and provide an electrical signal representative thereof. One such keyboard scanning mechanism is disclosed in the U.S. Pat. to Schafer No. 2,989,729 which discloses the application of at least two complete electrical scan signals of the conditions of the keyboard switches before a signal utilization device can be actuated thus assuring that the actuated switch will remain in circuit completing condition for the duration of the first signal and part of the second signal. A second generally related keyboard circuit is disclosed in the U.S. Pat. to Schrem No. 3,454,147 where provision is made for storing a signal generated by an actuated key in a corresponding position in a static storage register until a key generating a preceding signal has returned to its normal starting position. Other related keyboard sender circuits are disclosed in the U.S. Pats. to James No. 3,308,918, Burch et al. No. 3,377,622 and Houcke No. 3,457,368.

SUMMARY OF THE INVENTION

An important object of this invention is to provide an improved keyboard mechanism in which the keys are individually associated with actuatable electric switches and in which the switches are repetitively electrically scanned at a high rate to eliminate any failure conditions associated with the switches and for producing a signal representative of an actuated key for making one print or other utilization regardless of the number of times the actuated switch is scanned.

Another important object of the invention is to provide an improved scanning circuit for successively repetitively scanning a set of switches in succession by providing one read-out of a sensed closed switch in the set.

Another important object of the invention is to provide an improved keyboard mechanism which allows complete closure of a selected keyboard switch and provides a protective environment for the key actuated switches which enhances the usable life of the switch contact surfaces.

More specifically, the objects of the invention are effectively and economically carried out in cooperation with the use of the keyboard scanning technique in conjunction with a protective environment for the switch closure devices. Included in such a mechanism is a shift register which operates in timed relation to the scanning rate and which introduces a bit at one end and progressively shifts the same through the register to the other end in timed coincidence with the scan of the keyboard. Two extreme positions of the shift register are utilized for determining whether a print read-out or other utilization is to be made or whether such operation should be precluded. Included in the read-out circuit is a detector for sensing the condition of the extreme bit positions of the register and functioning to permit the read-out when a bit is sensed only in the first position of the shift register and to nullify the read-out if bits are sensed in both extreme positions of the shift register.

The above listed objects, advantages, and other meritorious aspects of the invention will be fully explained in the following detailed description. For a more complete understanding of the invention reference may be had to the following detailed description in conjunction with the drawings.

BRIEF DESCRIPTION OF THE DRAWINGS

A preferred embodiment of the invention may be considered as being divided into two major categories, one essentially structural and the other electronic. FIGS. 1 to 3 illustrate the physical aspects of the embodiment, and FIGS. 4 and 5 schematically represent the electrical circuits involved. As shown in FIGS. 1 and 2 of the drawings, the keys of the keyboard act through thin flexible members to bring two electrically conductive surfaces into contact to close a circuit. The base member of the keyboard is preferably a printed circuit board 10 of rectangular shape having electrically conductive or printed wiring 12 on the upper surface thereof, which as shown in FIG. 1 may extend at least to one marginal portion thereof. Superposing the board is a relatively thick, rigid layer or block of electrical insulating material. A plurality of depressible keys are mounted in the insulating block or layer 14, each key including a key stem 16 and a key top 17. Interposed between the board and block are two very thin flexible layers of material, the upper one is shown at 18 and may be wholly electrically conductive, such as a beryllium copper foil, and the lower one is shown at 20 and is a thin perforated electrically insulating sheet, such as a flexible plastic sheet sold under the name of Kapton. For purposes of clarity the thicknesses of the several flexible layers and printed wiring are considerably exaggerated in FIG. 1, it being understood that these elements are extremely thin. The foil 18 may be approximately 0.005 inch and the insulating sheet 20 may be in the order of 0.001 inch.

Figure 1:
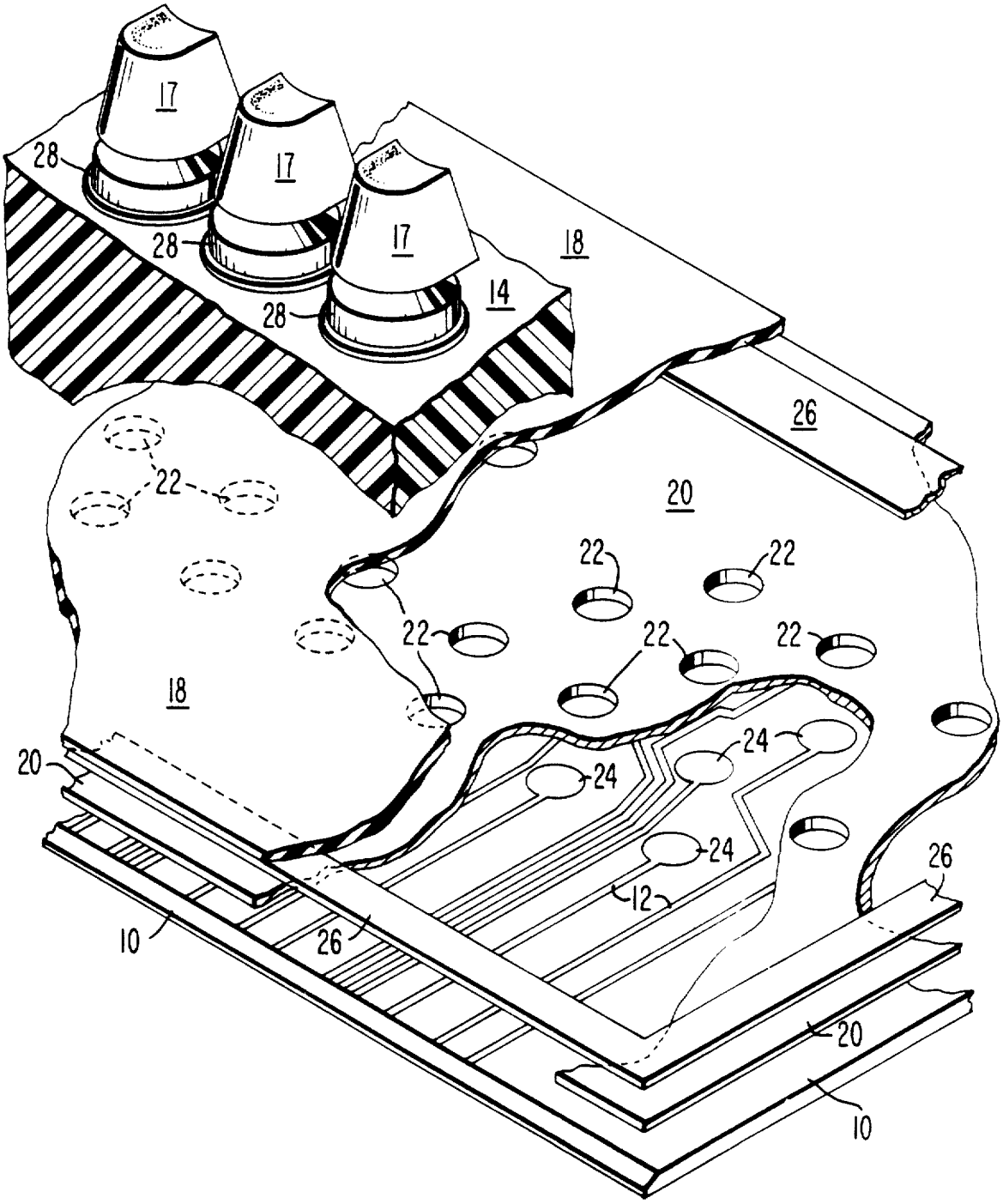
FIG. 1 is an exploded perspective view of one corner portion of the keyboard mechanism constructed in accordance with this invention and being partly broken away to disclose interior parts thereof.
Figure 2:
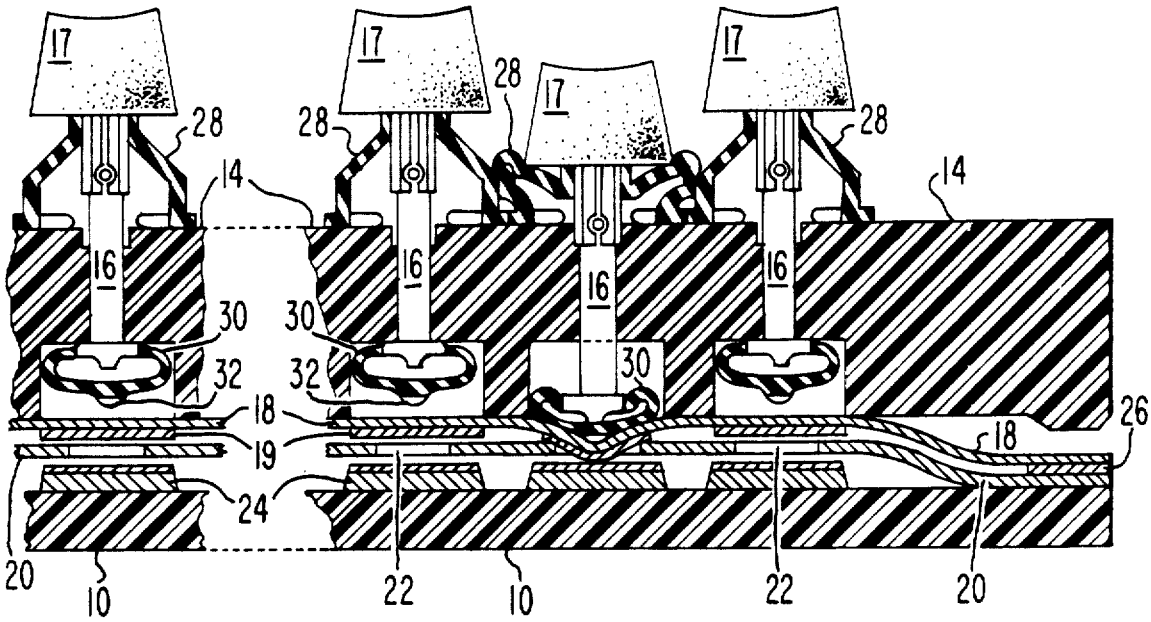
FIG. 2 is a vertical sectional view of the keyboard mechanism showing a plural number of actuatable keys and illustrating one of the keys in depressed position closing an electrical contact therewithin, certain elements of the mechanism forming a hermetically sealed chamber being shown in exaggerated thickness.

In properly assembled condition, as illustrated in FIGS. 1 and 2, the perforations 22 in flexible sheet 20 are registerable with the key stems so that the conductive foil 18, and preferably gold plated surface areas 19 thereof, can be brought into contact with similarly plated pads 24 forming part of the conductive wiring on the printed circuit board 10. Forming a border around the printed circuit board is an electrically conductive frame 26 which is interleaved between the conductive sheet 18 and the installation sheet 20. In the illustrated embodiment of the invention, the conductive sheet 18 may be maintained at the same potential as the conductive frame 26. The printed wiring on the board will normally be at a different potential. However, upon depression of a key, it will distort the immediate area of the sheet 18 through an aligned hole 22 in the insulating sheet 20 and into engagement with the aligned pad on the printed circuit board, thus modifying the potential of the printed wire associated with the pad and the depressed key and thereby distinguishing the wire or lead for that pad from all others on the board.

Before referring more particularly to FIG. 2, each key is yieldingly urged to its raised position by a resilient member in the form of a partially collapsible boot 28 which assumes the shape of a tapered collar encircling the upper portion of key stem and engages the underside of the key top with which it is associated. The bottom end of each key stem terminates in a diaphragm 30 formed of resilient material which is also partially collapsible when a key is depressed. Each diaphragm carries a thickened tapered protrusion 32 on the underside thereof which when its associated key is depressed as illustrated by a depressed key in FIG. 2 will force the immediate area of the conductive sheet 18 through the adjacent hole 22 of the insulating sheet and into engagement with the aligned pad 24 of the printed circuit board. When the activating force for depressing a selected key is removed, its associated boot 28 and diaphragm 30 will cooperate to urge the key to its inactive raised position.

Figure 3:
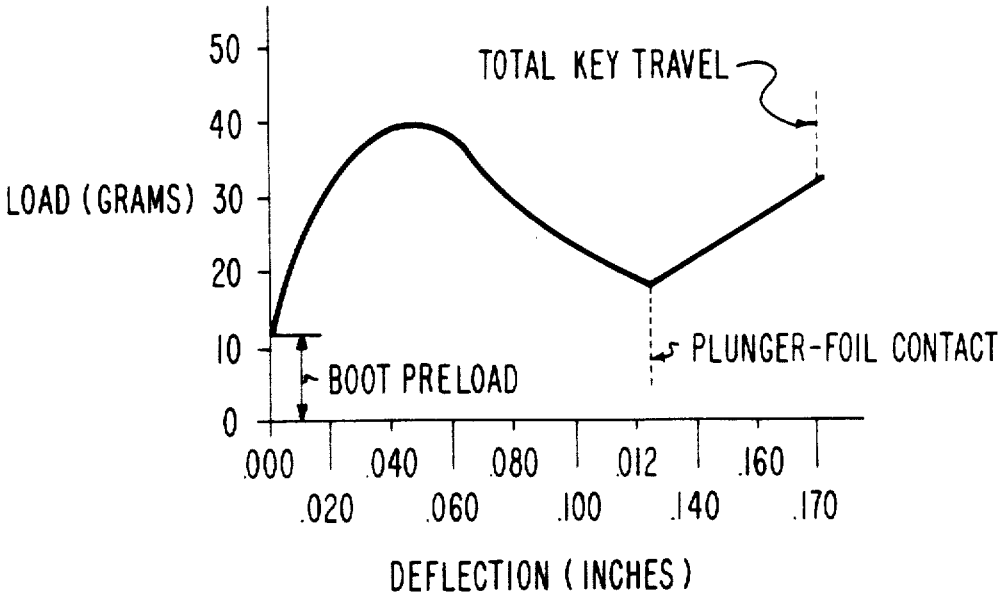
FIG. 3 is a graph illustrating the varying resistance to key actuation.

As illustrated by the graph in FIG. 3, each boot 28 applies an initial load on its respective key stem and progressively increases its resistance to the depression of the key for about a quarter of the total travel of the stem. Thereafter the resistance of each boot decreases. However, when foil contact is made the resistance of the diaphragm 30 comes into play and together with the boot applies a progressively increasing resistance to the force acting to depress the key. The general saddle-shape of the resistance graph in FIG. 3 is indicative of a desirable key-touch.

An important feature of the invention is the provision for hermetically sealing the flexible sheets and all but the extremities of the leads 12 from the atmosphere and particularly from the deteriorating effects of oxygen. For this purpose the thin flexible layers 18 and 20 and the conductive frame 26 are bonded to one another in overlapping relation and to the four marginal portions of the printed circuit board to form a hermetically sealed chamber within which the electrical contacts are housed. An inert gas, such as argon, is substituted for air in the sealed chamber. The inert gas prevents oxidation of the metallic parts within the chamber which would otherwise occur in an atmospheric environment.

Referring specifically to the FIGS. 4 and 5 where the electronic features are illustrated, a keyboard 40 of 100 manually depressible keys, such as previously described in connection with FIGS. 1 and 2, is associated with an open ended shift register 42 consisting of 101 flip flops capable of cycling a bit therethrough at the rate *corresponding to a keyboard scan time;* of approximately 20 milliseconds. Associated with each key of the keyboard is [an] *a* NAND gate, the complete set of said NAND gates for the 100 keys being illustrated in a binary to decimal converter generally indicated at 44 in FIG. 4 and in detail in the bottom portion of FIG. 5. Each NAND gate 45 is individually associated with a key stem 16 and depression thereof will close the output of its associated gate. The 100 NAND gates of the keyboard are serially scanned at the clock rate established for the system. The scanning of the keyboard always starts with the same key and runs through the bank of keys in the same order, with the result that [the value of] *a pulse for* any depressed key is entered into the *first or* "one" position of the shift register 42 at the time its NAND gate is scanned. For example, if the number eight key of the keyboard is depressed, it will not be read out of the keyboard until the eighth NAND gate 45 is scanned at which instant it will be entered as a bit into the first flip flop of the register 42. Thereafter, as the scanning of the keyboard continues, this bit will be shifted through the register 42 and unloaded into the 101st position thereof before it exits from the shift register.

The presence of a bit in the first position of the shift register will be sensed and fed to the input side of [an] *a* NAND gate 46 by means of a path 48. An output will appear on the output path 50 of the NAND gate 46 when concurrent signals of the same sign appear on three inputs to the gate, namely, the strobe line 52, the line 48 connected to the first position in the shift register, and the output of an inverter 54 the input of which is connected by path 56 to the 101st position of the shift register 42. The read-out pulse from the NAND gate 46 will pass through an inverter 58 to a series of seven NAND gates 60 which also have their inputs connected to the outputs of a 7-bit binary counter 62 which serves as the source of scanning pulses for successively feeding pulses to the NAND gates 45 of the binary to decimal converter 44 in the numerical order of the keys and which concurrently delivers binary coded pulses representative of each scanned key to certain of the set of NAND gates 60.

The binary to decimal converter unit 44 successively delivers a pulse to each of the pairs of contacts in the hermetically sealed portion of the printed circuit board, and finding a closed pair of contacts as a result of the depression of a selected key, the pulse delivered to such pair of contacts will be conveyed to the "one" position of the shift register 42. As shown in FIG. 4, such a delivered pulse is sent to two inputs of the shift register identified "S" and "R": the former by way of inverter 64 and the latter by branch line 66. The presence of a bit in the "one" position of [a] shift register *42 along with the absence of a bit in the 101st position, and the presence of a strobe signal 52,* will cause the delivery of a pulse on the output line 50 communicating with all of the [AND] *NAND* gates 60, and the arrival of this output coincident with the [counting] *count* of the binary counter 62 will signify in coded form the value or character of the actuated key. However, as explained herebelow, this signal will [only] occur *on the output termi-*

*nals of NAND gates 60 only* once during the depression of a key even though pulses derived from successive scans continue to pass through the closed pair of contacts of the actuated key.

A feature of the circuit resides in the provision for preventing repetitive signaling of the character associated with an actuated key even though successive scanning pulses are passed therethrough. Because of the very high speed of the scan, a key will normally be actuated for several cycles of the scan. If a signal is received by the NAND gate 46 from the first position of the shift register but not from the 101st position, a printout of the character of the depressed key will be made as previously explained. However, if signals are concurrently received by the NAND gate 46 from both the first and 101st positions of the shift register, indicating the presence of a bit in each of these positions, then in that event, because of the inversion of the signal from the 101st position an output signal on line 50 will not occur when NAND gate 46 is strobed. This provides only one printout for each depressed key and prevents any further printing from the depressed key unless a special repeat key is actuated for this purpose. In other words, the circuit will prevent a read-out *from NAND gates 60* to the printer because of the concurrent presence of a bit in the first and last positions of the shift register.

Expressed more succinctly than earlier described herein, the shift register 42 is comprised of N+1 positions or flip flops where N is the number of keys in the keyboard. The outputs of the "one" and "N+1" positions of the shift register are fed as the inputs to the gating circuitry. When a key is depressed its activation will be detected during a scanning cycle. The instant the activation is detected a bit will be entered into the "one" position of the shift register. As the scanning continues the bit will be shifted through the register to the last flip flop or the "N+1" position. The scanning rate is such that a key will normally remain depressed for more than one scan cycle. If a bit appears simultaneously at both the "one" position and "N+1" position of the shift register, the gating circuitry will inhibit the record printing or read-out of the character of the depressed key. Thus, unless [it] *repetitive printing of a character* is desired, only one printout of each depressed key will occur.

As suggested hereinabove, the circuit may have provision for repeating the printing of a character while a key is depressed. This is illustrated schematically on the block diagrams of FIGS. 4 and 5 and requires for this purpose the actuation of a special control key 68 characterized as "Repeat Enable" and certain circuit components and connections represented by [NOR gate 70 and NAND gate 72] *NAND gates 70 and 72* and their respective inputs. The inputs of [NOR] *NAND* gate 70 are connected individually to [the] *various* outputs of the binary to decimal converter unit 44 (*shown in FIG. 4 as the keys corresponding to counts 2, 4, 98 and 100*) and the NAND gate 72 has an input controlled by the repeat *enable* key *68*. When this *repeat enable* key is actuated, [the] *a* character [could] *can* be repetitively printed either for the time the selected key *associated with that character* is held down or until a certain count is reached.

It is believed that the operation of the mechanism is generally understood from the preceding description. Suffice to say that the binary counter 62 successively generates in timed relation to the basic clock rate the numerals from 1 to 100 pulses in binary notation and delivers such pulsed data to the set of NAND gates 60, and also to the code converter unit 44 where the pulses are converted to decimal notation and fed successively to the matrix of 100 NAND gates 45 illustrated in FIG. 5. The gates 45 are arranged in columns in numerical order and the first or "one" gate position is shown in the lower right corner of the matrix, and that position and the immediately adjacent positions are numbered "1", "2", "3", "4", etc. The columns of gates 45 are sequentially scanned in an upward direction and from right to left starting with the first or "one" position and proceeding through the columns to the last or 100th position shown in the left-most column. The scan is repeated over and over again at the relatively high scan rate *corresponding to keyboard a scan time* of 20 milliseconds, so that during the normal actuation of a key in the keyboard it will be scanned a plurality of times before being released. However, only the first scan of the actuated key will produce an intelligence signal on the outputs of the set of NAND gates 60, the remaining scans being ineffective because of the presence of a bit in the 101 or N+1 position of the shift register at the time the next scan introduces a bit into the "one" position of the register. In other words, if a bit is found to be present in the last bit position of the shift register in timed coincidence with the [commencement of the ] next scan of [the keyboard] *activated key* an effective output from the keyboard circuit is nullified *for that key*.

Figure 4:
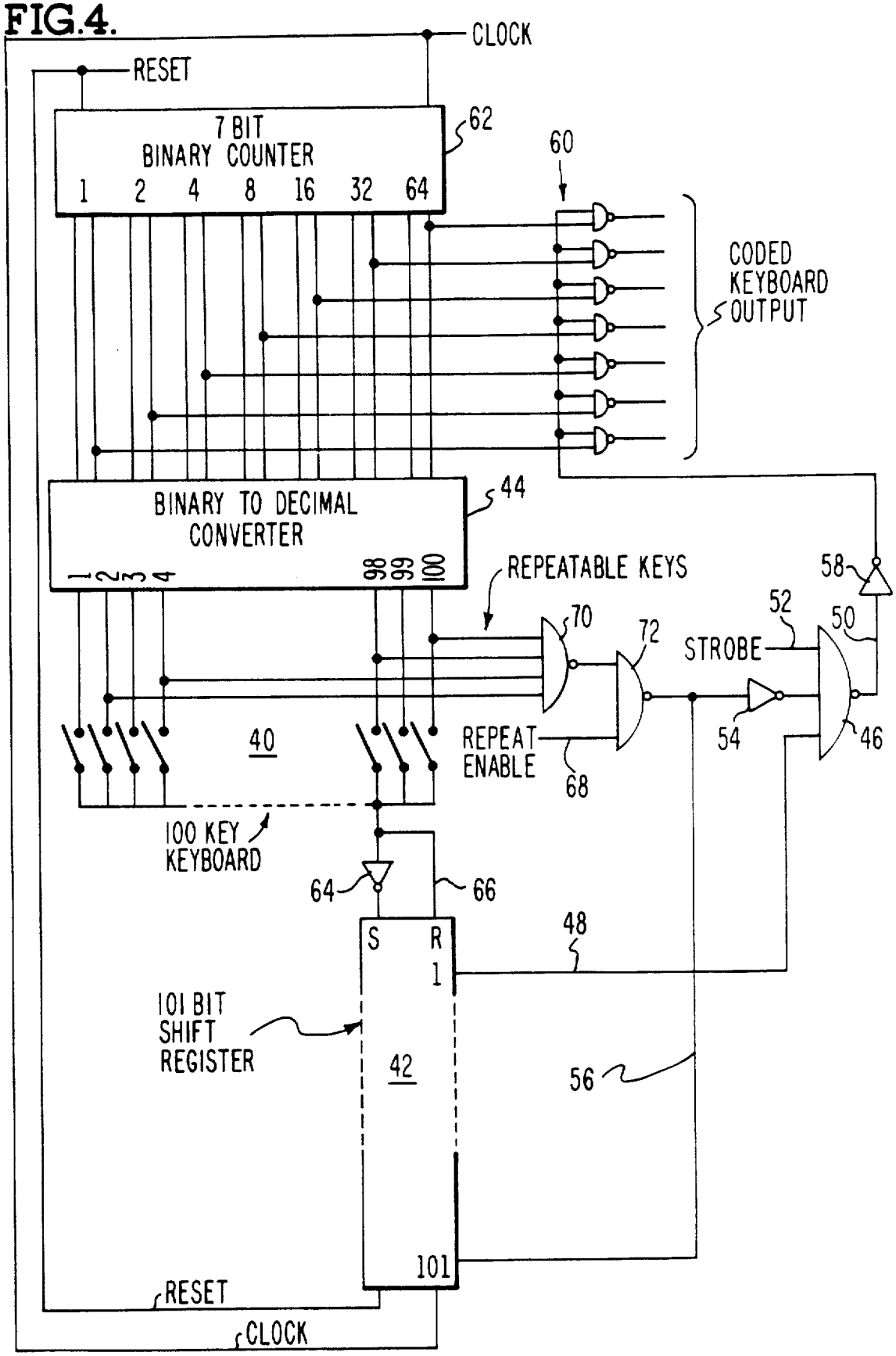
FIG. 4 is a schematic illustration of the circuit in general for scanning the switch devices of the keyboard and for converting binary signals to decimal signals.
Figure 5:
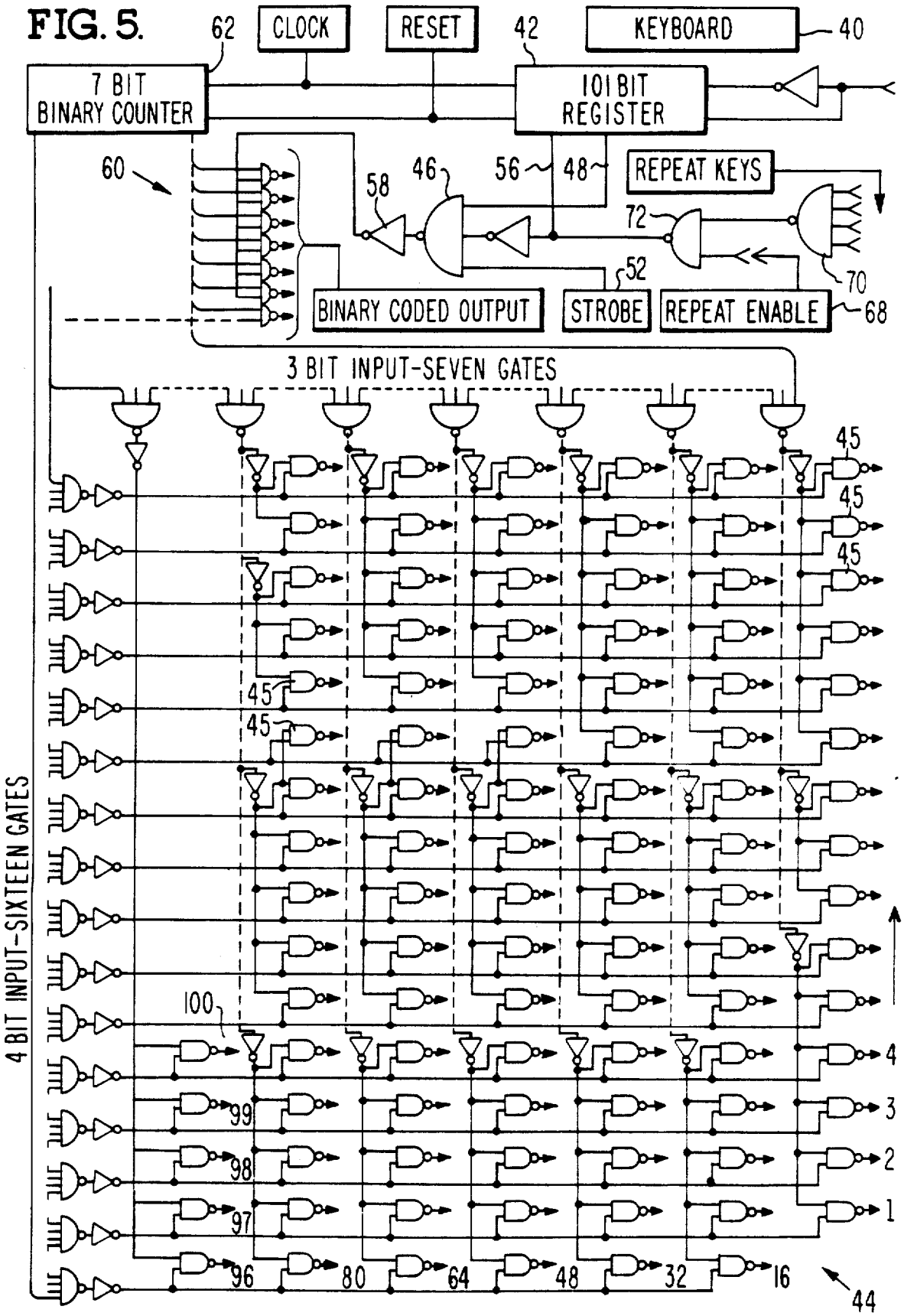
FIG. 5 is a similar schematic view showing in more detail the code converter portion of the keyboard circuitry with reference to the remaining parts of the circuit.

The schematic views of the circuit illustrated in FIGS. 4 and 5 include the clock and reset circuits for assuring repetitive cycling of the scan. During the actuation of a key, pulses from the code converter 44 are fed simultaneously to the S and R inputs of the shift register 42. Upon release of the actuated key and the opening of the pair of contacts associated therewith, the [operation of] *signal input to* the shift register *from that key* is discontinued, although both the binary counter 62 and the code converter 44 may continue to operate.

While a particular embodiment of the invention has been shown and described, it will be understood, of course, that it is not desired that the invention be limited thereto since modifications may be made, and it is therefore contemplated by the appended claims to cover any such modifications as fall within the true spirit and scope of the invention.

What is claimed is:

1. A keyboard operated machine including a plurality of actuatable keys each being operable from a normal inactive position to an actuated position and a plurality of pairs of normally spaced apart contacts each pair being individually associated with a key of the keyboard and responding to actuation of its key by engaging one another, a shift register of N+1 stages wherein N is the number of keys in the keyboard, means for sequentially electrically pulsing the pairs of contacts of the keyboard in succession and operable upon detection of an engaged pair of contacts for immediately entering a bit into the "one" stage of the shift register, means for continuously repeating the sequential pulsing of said plurality of pairs of contacts at a rate such that more than one such pulsing cycle occurs during a normal actuation of a key of the keyboard, means for shifting a bit entered into the "one" stage of the register through register to the N+1 stage in timed relation to the successive pulsing of the contacts of the keyboard, and circuit gating means connected to the outputs of the "one" stage and the N+1 stage of the shift register and being operable to transmit an intelligence signal to a utilization device when a bit appears only in the "one" stage of the shift register but inhibiting the transmission of such an intelligence signal when a bit concurrently appears in both the "one" stage and the N+1 stage of the shift register.

2. In a keyboard operated machine including a plurality of actuatable keys each being operable from a normal inactive position to an actuated position in engagement with an actuated contact to send an intelligence signal, the invention which comprises:

a shift register of N+1 stages wherein N is the number of keys in the keyboard;

means for repetitively scanning the contacts of the keyboard in succession and operable upon detection of an actuated contact of the keyboard for instantly entering a bit into the "one" stage of the shift register;

means for shifting the bit through the register in timed sequence with the scanning of the contacts of the keyboard and entering the bit into the N+1 stage thereof; and circuit gating means connected to the outputs of the "one" stage of the N+1 stage of the shift register and being operable to transmit an intelligence signal to a utilization device signifying the character of the actuated key when a bit appears only in the "one" stage of the shift register but inhibiting the transmission of such an intelligence signal when a bit appears concurrently both in the "one" stage and the N+1 stage of the shift register.

3. The invention as set forth in claim 2 characterized in that the keys of the keyboard are manually actuatable and in that said scanning means repetitively scans the contacts of the keyboard at such a rate that more than one scanning cycle occurs during a normal manual actuation of the key.

4. In a code signal sender, a plurality of electrical contact pairs each pair being capable of assuming an opened circuit condition and a closed circuit condition;

a shift register comprised of at least as many stages as is the number of said plurality of contact pairs;

means for repetitively scanning said plurality of contact pairs in succession and upon detection of a closed pair for entering a bit into the first stage of the shift register and for shifting the bit through the register to the last stage thereof; and circuit gating means connected to the first and last stages of the shift register and being operable to transmit a signal representative of any closed pair of contacts detected by said scanning means when a bit appears only [in] *at* the first stage of the shift register but being inoperable to signal in such manner when a bit is [concurrently present in both] *at* first and *in* the last [stages] *stage* of the shift register.

5. In a code signal sender in accordance with claim 4 wherein the shift register is comprised of one more stage than is the number of the plurality of contact pairs.

6. In a code signal sender in accordance with claim 5 wherein said plurality of contact pairs are each individually associated with a different mechanically operable key of a keyboard and wherein means is responsive to the actuation of any one of said keys for causing its associated electrical contact pair to assume a circuit closed condition.

7. In a code signal sender in accordance with claim 6 wherein said scanning means repetitively scans the electrical contact pairs at such a rate that more than one scanning cycle occurs during the actuation of a key of the keyboard.

8. A keyboard operated machine including a keyboard having a plurality of actuatable keys each being operable from a normal inactive position to an actuated position and a plurality of pairs of normally spaced apart electrical contacts each pair being individually associated with a key of the keyboard and responding to actuation of its key by engaging one another, a shift register of N+1 stages wherein N is the number of keys in the keyboard, means for sequentially electrically pulsing the pairs of contacts of the keyboard in succession and operable upon detection of an engaged pair of contacts for immediately entering a bit into the "one" stage of the shift register, means for repetitively cycling the sequential pulsing of said plurality of pairs of contacts at a rate such that more than one such pulsing cycle occurs during a normal actuation of a key of the keyboard, means for shifting a bit entered into the "one" stage of the register through the stages of the register to the N+1 stage in timed relation to the successive pulsings of the pairs of contacts of the keyboard, and circuit means connected to the "one" stage and to the N+1 state of the shift register and being operable to transmit an intelligence signal to a utilization device when a bit appears only in the "one" stage of the shift register but inhibiting the transmission of such an intelligence signal when a bit concurrently appears in both the "one" stage and the N+1 stage of the shift register.

9. A code signal sender including, in combination;

a plurality of pairs of electrical contacts, each contact pair representing a different character and being capable of assuming an opened circuit condition and a closed circuit condition;

means for sequentially scanning the plurality of electrical contact pairs for detecting a closed condition of any one of said contact pairs and generating a signal in response thereto;

means for generating an electrically coded representation of the character associated [witch] *with* such a detected closed contact pair;

means operatively connected to said plurality of electrical contact pairs and responsive to said signal signifying the closed condition of any one of the contact pairs thereof for temporarily storing that signal until the contact pair producing such signal is scanned again;

means operatively connected to said storage means and operative to sense the initial storage of said signal responsive to such sensing for causing the transmission of the coded representation of the character associated with the closed contact pair responsible for the storage of the signal; and means for sensing the presence of the signal in said storage means during a subsequent scan of the plurality of contact pairs for effectively preventing a repetitive transmission of the coded representation of the character associated with the closed contact pair responsible for the stored signal.

10. In a code signal sender in accordance with claim 9 wherein the signal storage means is a serial register comprised of at least one more stage than is the number of the plurality of contact pairs.

11. In a code signal sender in accordance with claim 10 wherein each contact pair of said plurality of contact pairs is individually associated with a key of a keyboard and wherein means is responsive to the actuation of any one of said keys for causing its associated electrical contact pair to assume a circuit closed condition.

12. In a code signal sender in accordance with claim 11 wherein said scanning means repetitively scans said electrical contact pairs at such a rate that more than one scanning cycle occurs during normal actuation of a key of the keyboard.

13. In a keyboard operated machine including a plurality of actuatable keys each being operable from a normal inactive position to an actuated position and further including a plurality of switches each associated with an individual one of the keys and responsive to the actuation of its associated key to change from circuit opened condition to circuit closed condition thereby to send an intelligence signal, the invention which comprises:

a shift register of N+1 stages wherein N is the number of keys in the keyboard;

means for repetitively scanning said plurality of switches in succession and operable upon detection of a switch in circuit closed condition for instantly entering a bit into the "one" stage of the shift register;

means for shifting the bit through the shift register in timed sequence with the scanning of the switches and entering the bit into the N+1 stage thereof; and means connected to the outputs of the "one" stage and the N+1 stage of the shift register and being operable to transmit an intelligence signal to a utilization device which is significant of the actuated key when a bit appears only in the "one" stage of the shift register but inhibiting the transmission of such an intelligence signal when a bit appears concurrently both in the "one" stage and the N+1 stage of the shift register.

14. The invention as set forth in claim 13 characterized in that the keys of the keyboard are manually actuatable and in that said scanning means repetitively scans the switches of the keyboard at such a rate that more than one scanning cycle occurs during a normal manual actuation of a key.

15. In a code signal sender, a plurality of electrical switches each being capable of assuming an open circuit condition and a closed circuit condition;

a shift register comprised of at least as many stages as is the number of said plurality of switches;

means for repetitively scanning said plurality of switches in succession and operable upon detection of a switch in closed circuit condition to enter a bit into the first stage of the shift register and for shifting the bit through the register to the last stage thereof; and means connected to the first and the last stages of the shift register and being operable to transmit a signal representative of any such switch in closed circuit condition detected by said scanning means when a bit appears only in the first stage of the shift register, but being inoperable to transmit in such manner when a bit is [concurrently present in both] *at* the first and *in* the last stage [s] of the shift register.

16. In a code signal sender in accordance with claim 15 wherein the shift register has one more stage than the number of switches in said plurality of switches.

17. An electrical signal sender including a plurality of electrical switches each being operable to assume a normal inactive condition and a temporary active condition;

a shift register of N+1 stages wherein N is the number of said plurality of switches;

means for sequentially electrically pulsing said plurality of electrical switches in succession and operable upon detection of a switch in a temporary active condition for immediately entering a bit into the "one" stage of the shift register;

means for repetitively cycling the sequential pulsing of said plurality of switches at a rate such that more than one such pulsing cycle occurs during the temporary active condition assumed by any one of the plurality of switches;

means for shifting a bit entered into the "one" stage of the register through the stages of the register to the N+1 stage in timed relation to the successive pulsings of the plurality of switches; and circuit means connected to the "one" stage and to the N+1 stage of the shift register and being operable to transmit an intelligence signal to a utilization device when a bit appears only in the "one" stage of the shift register, but being inoperable to transmit such an intelligence signal when a bit concurrently appears in both the "one" stage and the N+1 stage of the shift register.

18. A code signal sender including, in combination; a plurality of electrical switches each representing a different character and being capable of assuming a normal inactive condition and a temporary active condition;

means for sequentially scanning the plurality of electrical switches for detecting a temporary active condition of any one of said switches and generating a signal in response thereto;

means for generating an electrically coded representation of the character associated with such a detected active conditioned switch;

means operatively connected to said plurality of electrical switches and responsive to an aforesaid signal signifying the active condition of any one of the switches thereof for temporarily storing that signal until the switch producing such signal is scanned again;

means operatively coupled to said character representation generating means and to said storage means and being operable to sense the initial storage of said signal in the storage means and being responsive to such sensing for causing the character representing generating means to transmit the coded representation of the character which is associated with the detected active conditioned switch to a utilization device; and means for sensing the presence of the signal in said storage means during a subsequent scan of the plurality of switches for effectively preventing a repeated transmission of the coded representation of the character associated with the active conditioned switch responsible for the signal.

*19. A keyboard encoder for generating a signal for each new key depressed in a keyboard having a plurality of keys.*

*whether or not a previously depressed key still remains depressed, comprising:*

*scanning means for serially scanning each key of the keyboard along a predetermined scan pattern to produce an information train containing one time interval for each of the keys of the keyboard, and containing within each such time interval a signal if the corresponding key is depressed,*

*a comparison circuit having at least first and second input terminals and an output terminal for generating an output signal during each said serial scan whenever a signal appears on its first input terminal and not on its second input terminal,*

*a storage device having a storage capacity at least sufficient to store a number of signals equal to the number of keys of the keyboard, the output of said storage device being electrically connected to the second input terminal of the comparison circuit,*

*circuit means coupling said scanning means to said storage device for supplying said information train to said storage device to store therein information signals corresponding to one complete scan of the keyboard,*

*circuit means coupling said scanning means to the first input terminal of said comparison circuit for supplying said information train serially to said first input terminal as the keyboard is being scanned, and*

*means for advancing out of the storage means, to the second input terminal of the comparison circuit, the information train then stored in the storage device from the previous scan of the keyboard, synchronously with the signal information being received by the first input terminal from the current serial scan of the keyboard,*

*the output terminal on said comparison circuit generating a key-detect signal when said first input terminal receives a signal from the present scan of the keyboard while the second input terminal fails to receive a signal from the corresponding key in the previous scan.*

*20. A keyboard encoder as in claim 19 wherein the storage device is a shift register.*

*21. A keyboard encoder as in claim 19 wherein the information derived from the keyboard is digital in nature, being either of two levels depending upon whether or not a key is depressed, these levels representing the digits 1 and 0 respectively, and*

*wherein the comparison circuit is a 0/1 detector in that it generates an output signal when the input on its first and second input terminals are 1 and 0, respectively.*

*22. A keyboard encoder as in claim 19 further including gating means connected electrically to said keyboard and to the output terminal of the comparison circuit,*

*said gating means operating to pass information received from said keyboard whenever it is supplied by a key-detect signal from said comparison circuit.*

*23. A real time N-key rollover protection logic circuit for generating a single signal for each new key depressed in a keyboard having a plurality of keys, whether or not previously depressed keys still remain depressed, comprising:*

*storage means for receiving an information train from a keyboard representative of one complete scan of the keyboard, and containing a signal for each key that is depressed,*

*a comparison circuit having first and second input terminals for receiving at its first input terminal a serial information train derived from a serial scan of the keyboard, while the keyboard is being scanned, and while the storage means is receiving the same information train,*

*circuit means connecting the output of said storage means with the second input terminal of said comparison circuit,*

*means for advancing the information train serially out of said storage means to the second input terminal of the comparison circuit, synchronously with the receipt at the first input terminal of the comparison circuit of a serial information train derived from a real time scan of the keyboard, and*

*an output terminal of said comparison circuit for producing a key-detect signal whenever said first input terminal receives a key-depressed signal from a keyboard scan while the second input terminal fails to receive a corresponding key-depressed signal from the previous scan of the keyboard.*

*24. A keyboard encoder circuit for generating a signal representing the actuation of a key in the keyboard, including:*

*scanning means for serially scanning the keys of the keyboard in successive scan cycles to provide in each scan cycle data bits serially generated which identify the state of actuation of each key,*

*storage means for storing during each scan cycle the data bits representing the actuation states of the keys during the cycle, and for providing serially generated output signals during the next scan cycle representing the data bits stored during the previous scan cycle, the output signals being provided in time coincidence with the data bits generated by the scanning means during said next scan cycle, so that a stored data bit for a key is reproduced at the same time that the scanning means provides a new data bit for that same key, and*

*gate means provided with the serially generated data bits and the output signals from said storage means for generating a key-detect signal upon receipt of both a data bit representing a key in an actuated state during a scan cycle and an output signal from said storage means representing the same key in a non-actuated state during the previous scan cycle, so as to generate key-detect signals only upon the initial actuation of the keys in the keyboard.*

* * * * *